United States Patent [19]

Higgs

[11] Patent Number: 4,709,214
[45] Date of Patent: Nov. 24, 1987

[54] INTEGRATED HALL ELEMENT AND AMPLIFIER WITH CONTROLLED OFFSET VOLTAGE

[75] Inventor: Jacob K. Higgs, Salisbury, N.H.

[73] Assignee: Sprague Electric Company, North Adams, Mass.

[21] Appl. No.: 856,562

[22] Filed: Apr. 28, 2986

[51] Int. Cl.⁴ .............................................. H03F 15/00
[52] U.S. Cl. ......................................... 330/6; 330/252;
330/307; 357/27; 357/48; 307/309
[58] Field of Search ............................ 330/6, 252, 307;
307/309; 357/27, 48

[56] References Cited

U.S. PATENT DOCUMENTS 4,123,772 10/1978 Janssen .................................... 357/27
4,465,976 8/1984 Avery et al. ......................... 324/251
4,578,692 3/1986 Higgs et al. ........................... 357/27

OTHER PUBLICATIONS

Bosch et al, "Integrated Circuit with Hall Device for Brushless D.C. Motors", *Philips Technical Review*, vol. 31, Nos. 11–12, 1970, pp. 366–368.
IBM Technical Disclosure Bulletin, vol. 21, No. 7, Dec. 1978, "Monolithic Hall Cell System".

*Primary Examiner*—James B. Mullins

[57] ABSTRACT

An integrated circuit includes an epitaxial layer. In a near central region thereof is formed a symmetrical array of four equal sized Hall cells that are connected in parallel to form one Hall element. A moat surrounds the Hall element consisting of two concentric isolation walls separated by a band of opposite conductivity epitaxial material. The output of the Hall element is connected to the input of an adjacent differential amplifier that has two extraordinarily large amplifying transistors with emitter areas each equal to about a half of a Hall area, for achieving much better control over the relative dimensions of these emitters and thus over the amplifier offset voltage from chip to chip. The emitter resistors are likewise made very wide and both pairs of components are physically arranged to have balanced thermal coupling to the Hall element for further enhancing control of offset voltage.

6 Claims, 4 Drawing Figures

INTEGRATED HALL ELEMENT AND AMPLIFIER WITH CONTROLLED OFFSET VOLTAGE

BACKGROUND OF THE INVENTION

This invention relates to a semiconductor integrated circuit chip including a Hall element connected to a differential amplifier and, more particularly, to such an integrated circuit having a low offset output voltage.

The integrated Hall element is typically comprised of a PN-junction-isolated thin epitaxial region of N-type having a pair of oppositely disposed ohmic contacts by which a constant energizing voltage may be established through the epitaxial Hall element region along one Hall axis, and another pair of oppositely disposed output ohmic contacts lying in another axis of the Hall region having a direction at right angles to the one axis. A Hall voltage appears at the output contact having a magnitude and polarity corresponding to that of the magnetic field in the Hall element which is orthogonal to the two Hall axes.

When the Hall element is employed as a sensor of magnetic fields, it is usually important that the Hall output voltage be zero when the orthogonal magnetic field is zero. However, it has been impossible to manufacture Hall elements with a zero off-set voltage and efforts to understand and reduce or compensate Hall-element off-set voltage span two decades.

A primary requirement for low offset voltage is symmetry of the ohmic contacts about the two Hall element axes. But, even with perfect symmetry an offset voltage exists due to physical stresses in the integrated circuit that may have been built in during processing or imposed by a surrounding protective package.

Occassionally, an integrated Hall-element having a near zero offset voltage may be produced, but not reproducibly and usable because the stress-related causal factors have fortuitously been of such an opposing and cancelling effect.

Responding to this situation, there have been devised many offset-voltage compensating schemes. In general, these schemes are based upon a means for introducing a measured amount of asymmetry in the operation of the Hall element by an external circuit adjusting means. One approach is to add another energizing-current contact not in the one axis and supplying therethrough an offset-voltage adjusting current. Another and more varied approach supplied an offset-voltage adjusting current through just one of the existing Hall-element output contacts. In both approaches, the adjustment of the offset adjusting current is made for each integrated Hall-element after its manufacture.

Representative of the unbalanced energizing current approach is that described in the IBM Technical Disclosure Bulletin, Vol. 21, No. 7, December 1978, pages 2717–2718. In the patent to Avery and Higgs, U.S. Pat. No. 4,465,976 issued Aug. 14, 1984 that is assigned to the same assignee as is the present invention, there is described an integrated Hall-element representative of the unbalanced Hall-element output current approach. In the copending application to Higgs and Humenick to be issued as U.S. Pat. No. 4,578,692 on Mar. 25, 1986, and assigned to the same assignee as is the present invention, there is described a direct approach to reducing stress related offset voltage in an integrated Hall element. There, an array of four Hall cells are included having their outputs connected in parallel and having opposing energizing currents so that the offset voltage of one is offset by that of another and the composite offset voltage is thereby notably reduced as was known in the prior art, However, the four Hall-cells acting as one Hall element in this patent are surrounded by a wide PN-junction isolated moat that further reduces the generation of an offset voltage by isolating the four self compensating cells from the surrounding circuits wherein unsymmetrically doped regions inducing internal stresses in the semiconductor substrate are prevented from creating unsymmetrical stresses on the quad Hall element.

It is an object of the present invention to further reduce and to better control the offset voltage of an integrated circuit including a quad Hall element and Hall-voltage amplifer.

SUMMARY OF THE INVENTION

An integrated circuit chip includes a substrate of one conductivity type with an epitaxial layer of the opposite type grown on one face thereof. A Hall element is made up of an array of four separate Hall cells having their outputs connected in parallel and disposed in an approximately central portion of the outer surface of the epitaxial layer.

Another portion of the epitaxial layer surrounding the Hall element contains a Hall-voltage-amplifying differential amplifier circuit and other circuit components. The differential amplifier circuit includes two bipolar transistors. The Hall element is separated from the transistors and other components by a moat surrounding the Hall element. The moat is made up of two heavily doped isolation walls with a band of epitaxial material of the opposite polarity type in between to isolate the Hall element from built-in stresses in the surrounding epitaxial layer portion.

The amplifying transistors are positioned adjacent each other and on either side of an axis of the Hall element so that the transistors have equal thermal coupling to the Hall element. The areas of the emitters of these transistors are unusually large, namely at least 15% as large as the area of one of the Hall elements.

This invention recognizes that in integrated circuits as described in the above-noted patent U.S. Pat. No. 4,465,976 each having a moat-protected four-cell Hall element followed by a standard differential amplifier, the variability from chip to chip in manufacturing of the Hall element offset voltage is so low that the source of variability in the offset voltage at the output of the amplifer is mainly attributable to lack of control of balance in the amplifier itself.

Furthermore, this invention recognizes that to maintain control of the composite offset voltage of the combination of Hall elements plus differential amplifier in each chip during manufacture, the pairs of amplifier components and especially the pair of amplifying transistors must for that purpose have a balanced thermal coupling to the Hall element which is a dominant source of heat generation on the chip.

BRIEF DESCRIPTION OF THE DRAWINGS

FIGS. 2 and 3 are to the same scale which is reduced by a factor of 0.58 relative to the horizontal scale of FIG. 1.

DESCRIPTION OF THE PREFERRED EMBODIMENT

Figure 1:
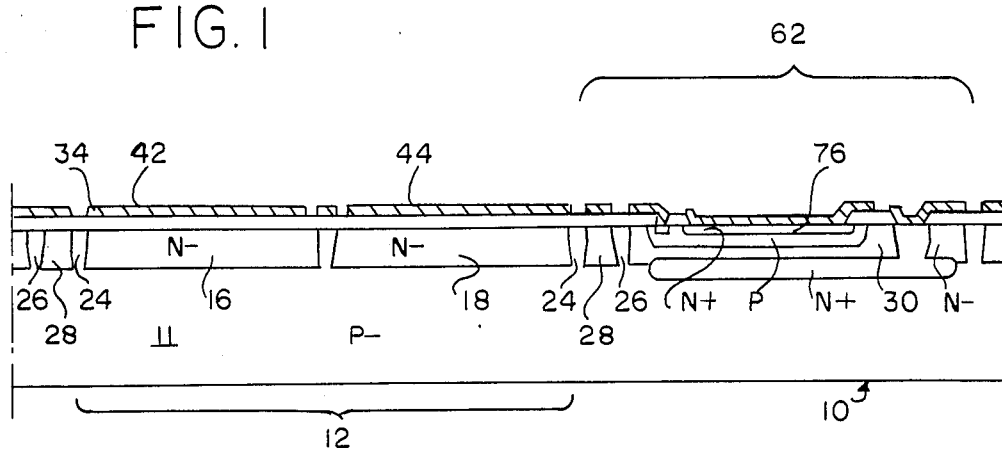
FIG. 1 shows in cross-sectional view an integrated circuit of this invention taken in a plane 1—1 showing two of a four-cell Hall element bound by a stress relieving moat and one of a pair of large transistors for amplifying the Hall voltage.
Figure 2:
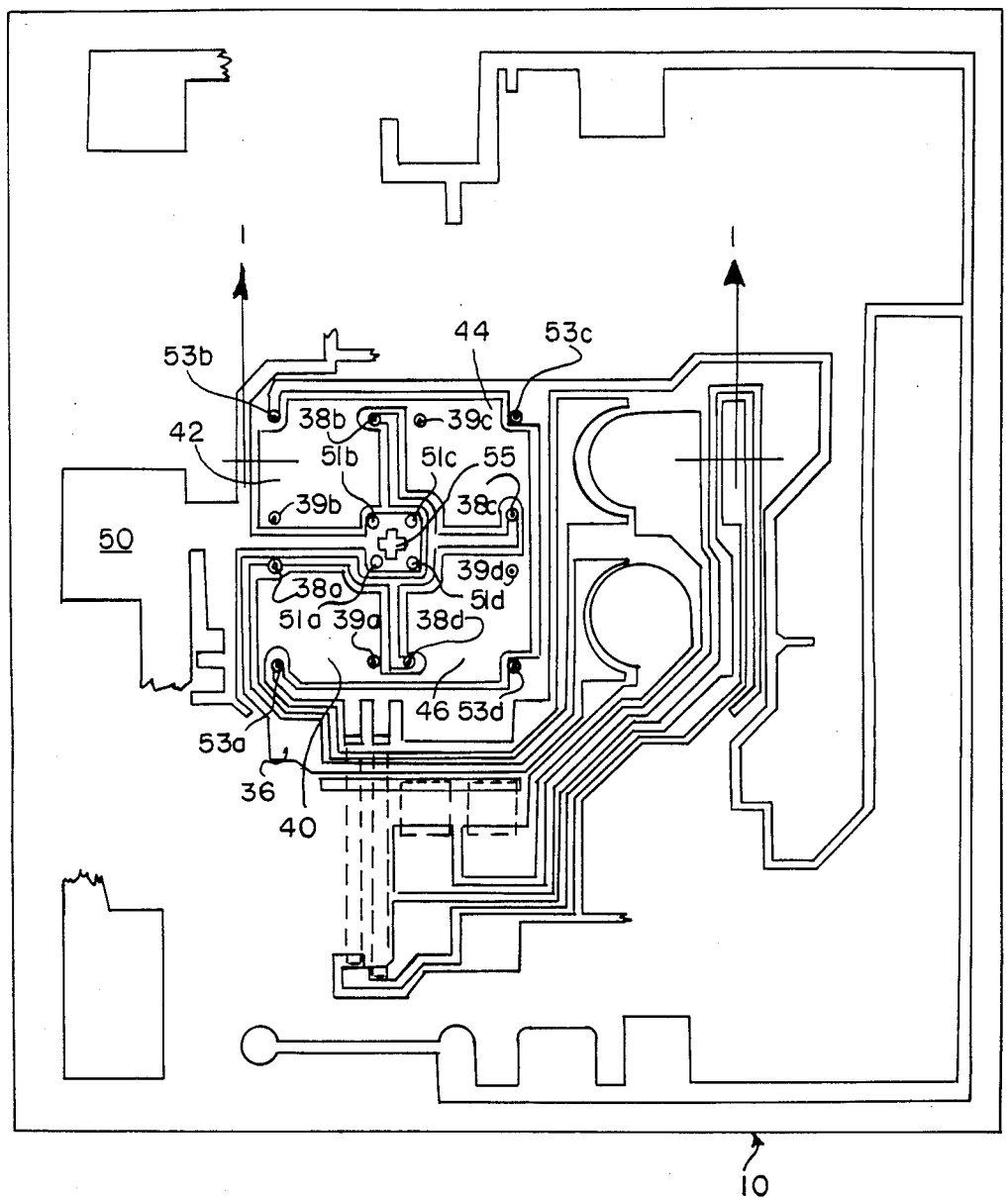
FIG. 2 shows in a partially developed plan view the integrated circuit of FIG. 1 including the location of plane 1—1.
Figure 3:
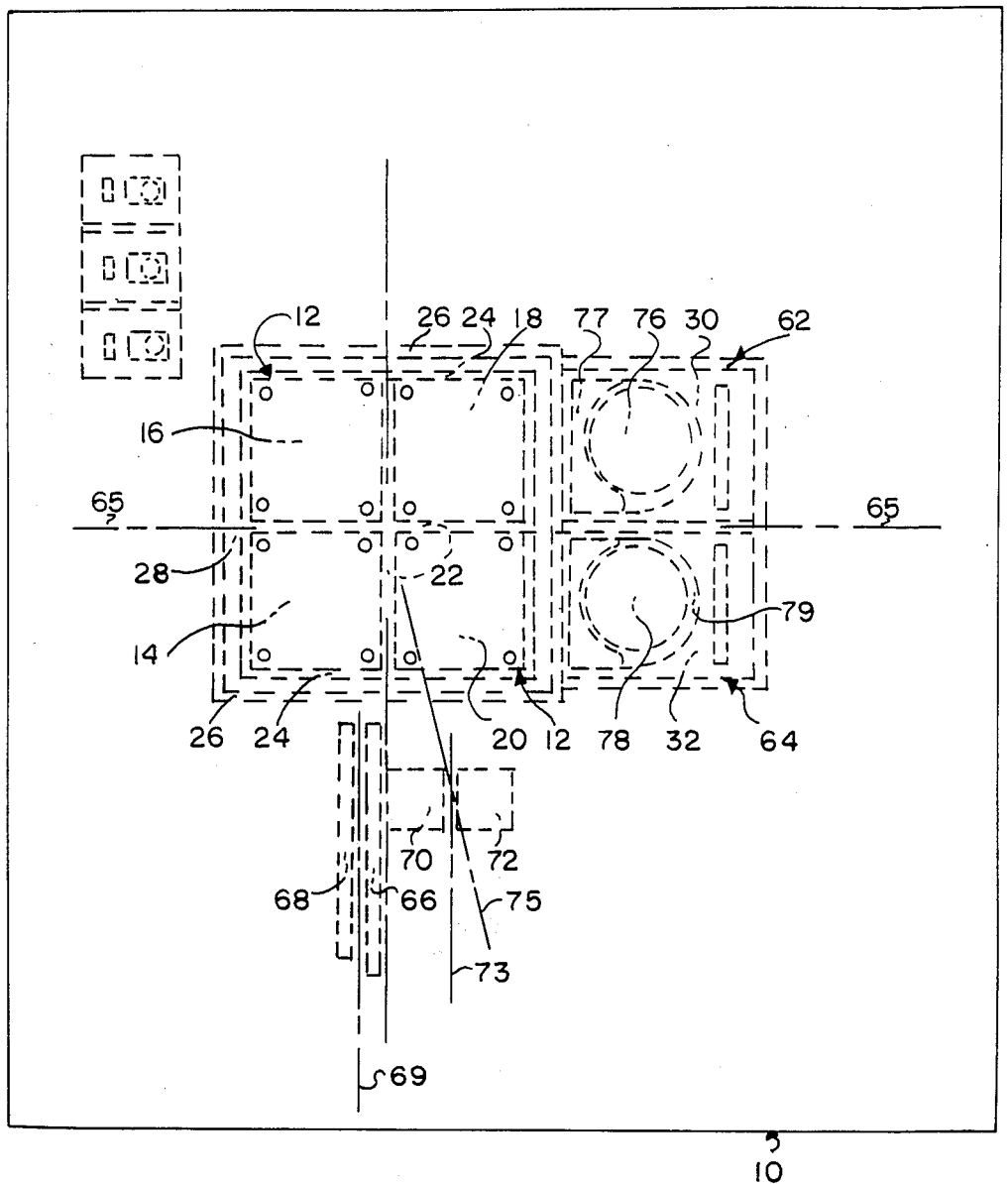
FIG. 3 shows another partially developed plan view of the integrated circuit of FIG. 2 with the metal conductors removed and transistors shown by dashed lines under the passivating layer.

Referring to FIGS. 1, 2 and 3, an integrated circuit chip 10 includes a Hall element 12 that is made up of an array of four Hall cells formed in the epitaxial pockets 14, 16, 18 and 20 over a P-silicon substrate 11. Those pockets are separated by a cross-shaped system of P+ isolation walls 22. This four-cell Hall element is surrounded and circumscribed by an annular isolation wall 24. Wall 24 is in turn surrounded by an outer isolation wall 26 that is spaced from and roughly concentric with wall 24. There is left between walls 24 and 26 an N-epitaxial band 28. Adjacent to the Hall element 12 are epitaxial pockets 30 and 32. In FIG. 1 an insulative passivating layer 34 is shown covering the epitaxial surface of the chip 10.

Several structural features of the integrated circuit chip 10 are aimed at minimizing stresses on the Hall element 12 within the chip 10 or at giving symmetry to stresses that tend to contribute to the Hall element output voltage.

Hall element 12 is well inboard and in fact is about centered within chip 10 to avoid stresses associated with the chip edges. It also reduces packaging stresses both flexing and compressing.

A system of metal film conductors includes four plates 40, 42, 44 and 46, respectively, overlying the Hall-cell pockets 14, 16, 18 and 20, and electrically connected together and to sensing contacts 38a, 38b, 38c and 38d and to the test pad 36. Hall sensing contacts 39a, 39b, 39c and 39d are effected by conductors 40, 42, 44 and 46, respectively, through holes (not shown) in the insulative passivating layer 34. Conductors 40, 42, 44 and 46 are made broad over a major portion of each Hall cell to keep the Hall cell surfaces below at the same potential which stabilizes the surface electrically and leading to a lower more predictable offset voltage as well as less drift with time.

Each of the four Hall cells has a pair of power contacts 51 and 53 lying in a radial axial line (not shown) relative to the center of the Hall element 12 as seen in FIG. 2. These contact pairs 51a–53a, 51b–53b, 51c–53c and 51d–53d are connected in parallel so that, when connected to a DC power source, the Hall element exciting current flows in symmetrical radial directions relative to the center of the Hall element 12. The small cross shaped contact 55 grounds the underlying P+ isolation wall 22 and thus the P-substrate. Metal pad 50 may be connected to an external ground via a standard bonded wire (not shown).

Referring to FIGS. 1 and 2, power contacts 51a–53a, 51b–53b, 51c–53c and 51d–53d, respectively, for each Hall cell are also connected in parallel in such directions that tend to buck out the offset voltages of the Hall cells to minimize the stress-induced offset voltage at the output of the Hall element 12.

The Hall element 12 has an epitaxial layer thickness of 11 microns and is surrounded by a moat including a wide region of uniform dopant profile e.g. P+ wall 24 and N-epitaxial band 28 and P+ wall 26 totalling 50 microns. This moat occupies more chip real estate than is desirable but for most uses this cost is more than repaid by the ameliorated stresses on the Hall element that leads to better control of the Hall output offset voltage. This is more fully explained in the above-noted patent U.S. Pat. No. 4,465,976. The outer moat wall 26 has a width of 10 microns but may be larger where convenient. The inner moat wall 24 is 10 microns wide.

A number of wafers were manufactured each containing hundreds of integrated circuit chips of the kind described as the second embodiment in the above-noted patent U.S. Pat. No. 4,465,976. Each chip included a Hall element composed of an array of four Hall cells surrounded by a double isolation wall protective moat and an amplifier. Measurements were made, with no magnetic field, of the Hall element output voltages and of the differential amplifier output voltages for a group of integrated circuit chips from one wafer that were representative of chip locations over the entire surface of the wafer.

This combination of a four-cell Hall element and protective moat produced surprisingly low mean Hall element output (offset) voltage, 0.32 mv. Expressed as a magnetic field equivalent that amounts to about 17 gauss. But more unexpected was the very low accompanying spread from chip to chip of these offset voltages, namely, the standard deviation was found to be 0.22 mv.

Also for the chips contributing to the quad Hall element offset voltage data, the measurement was also made of the offset voltage seen at the output of the differential amplifier. This measurement, of course, includes asymmetries in both the Hall element and the following onestage differential amplifier. The standard deviation of this composite offset voltage was found to be 13 mv.

Figure 4:
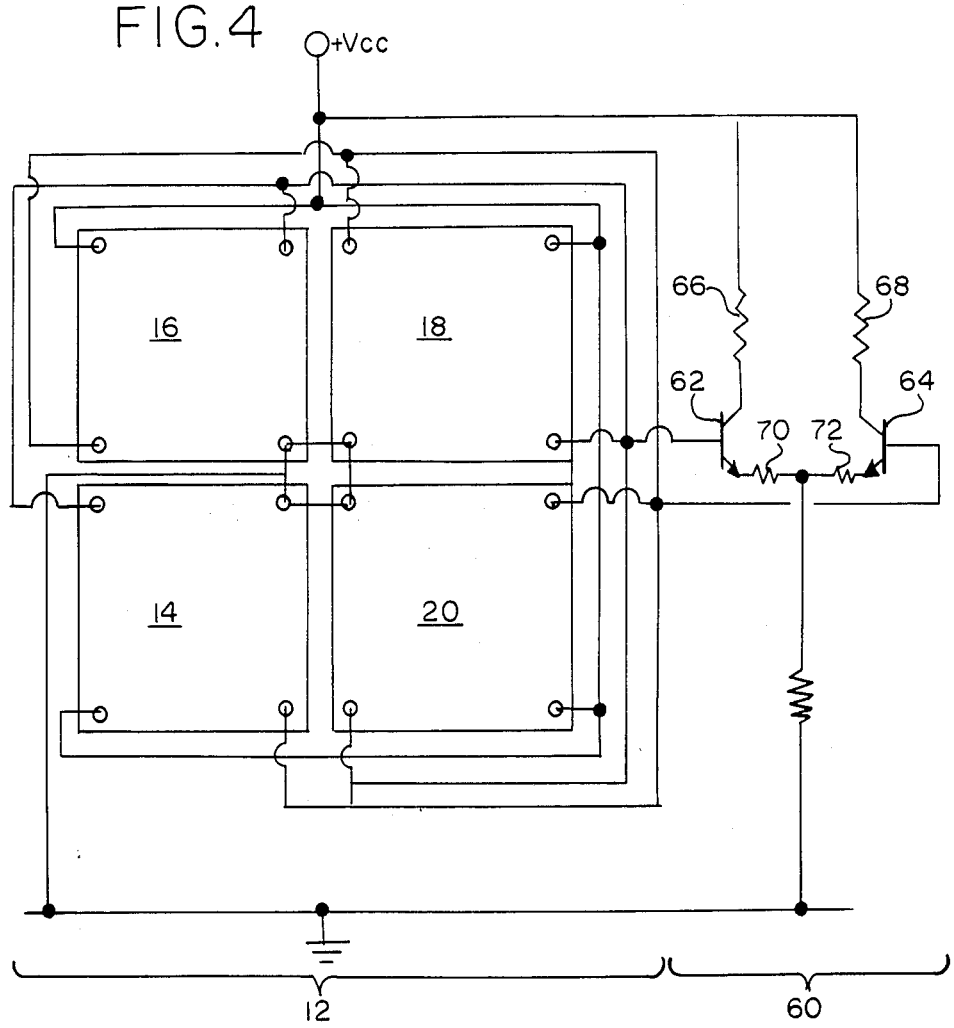
FIG. 4 shows a schematic diagram of the interconnected four cell Hall element and differential amplifier of the integrated circuit chip of FIGS. 1, 2 and 3.

The integrated chip 10 includes the differential amplifier 60 shown in the schematic diagram of FIG. 4 having its input connected to the output of the four cell Hall element 12. The two adjacent differentially connected amplifying transistors 62 and 64 as seen in FIG. 4 are symmetrically abutting and positioned on either side of a radial axis 65 that passes through the center of the four cell Hall element 12. This symmetrical position relative to a Hall element axis (65) is to provide a balanced thermal coupling of the two transistors 62 and 64 to the Hall element 12 so as to deliver heat at the same rate to these two transistors from the Hall element and thus avoid an imbalance of a transistor operational parameter, e.g. current gain, that would unbalance the amplifier output.

In a similar manner, the amplifier collector resistors 66 and 68 abut and are positioned symmetrically about a radial axis 69 of the Hall element 12; likewise the emitter resistors 70 and 72 abut and are symmetrically positioned on either side of a line 73 that is within about 25 degrees of a radial axis 75 of the Hall element 12. These positions are also for insuring near perfect thermal coupling of each resistor in a pair and thus an equal rate of heat transmitted to each resistor of a pair from the Hall element.

Since the sensitivity of a Hall element is directly proportional to the energizing current through it, there was always a great incentive to increase that current or for a given Hall element to increase the voltage across it, e.g. $V_{cc}$. However, any Hall element offset voltage also increases proportionally. The four cell Hall element surrounded by a protective moat makes the Hall element offset voltage much smaller than heretofore realizable rendering the ratio of Hall sensitivity to offset greater. And now, with the balanced thermal coupling of the amplifier component pairs, increases in energizing current have no substantial effect upon the amplifier-attributable offset voltage.

While the above noted positions reduce thermal gradients between pairs of differential amplifier components, the same components are made to a size and shape that reduces the occurrence of imbalance between components of a pair due to random dimensional variations during manufacture.

Specifically, the emitters 76 and 78 of transistors 62 and 64, respectively, are made about thirty times larger, than for the standard normal integrated NPN transistors, and have an area of 18,900 square microns. This emitter area is one half the area of one Hall cell, each of which has an area of 40,000 square microns. The emitter areas of the above-noted prior art amplifier transistors are square and have an area of about 675 square microns. Two of those were connected in parallel to form each of the pair of differential amplifier transistors. Emitter areas are directly related to the key transistor parameters including current gain. The large emitter areas used here are reproducible to within a fraction of a percent from die to die and wafer to wafer. Thus the emitter geometry ratios between transistor pairs is very stable and reproducible during manufacture. In fact, to make the emitter areas 10 times larger than normal would significantly improve the control of the offset voltage. It follows that if the emitter areas are made at least 15 percent that of one Hall cell, control of this geometry ratio becomes a much less significant factor in the control of offset voltage. Also, a little bit better control of emitter dimensions is obtained by using a round emitter as has been done here.

In a similar manner, the emitter resistors are at least 40 microns wide. In this embodiment their width is 80 microns. Likewise the collector resistors, although not as critical, are made wider than usual. They are at least 15 microns and in this particular embodiment they are 20 microns wide.

Several wafers were made, each containing hundreds of integrated circuit chips of the above described preferred embodiment. Measurements were made, with no magnetic field, of the Hall element output voltages for a group of the chips that were representative of chip locations over the entire surface of one wafer.

The Hall element offset voltage has a standard deviation from chip to chip of 0.15 mv. The overall offset voltage as measured at the output of the differential amplifier has a standard deviation of 2.5 mv. The prior art integrated circuit of U.S. Pat. No. 4,465,976 noted above has essentially the same Hall element and moat design as do those of the preferred embodiment of this invention. Since the amplifier gain in both cases is about 11, a comparison of the overall offset standard deviation of the prior art chips at 13 mv relative to the overall standard deviation here of 2.5 mv reveals a very large improvement of about a factor of five.

The integrated circuit of the preferred embodiment is made by an entirely standard process well known in the integrated circuit art. It may be noted however, that the above described parts include emitter resistors 70 and 72, collector resistors 66 and 68 and transistor bases 77 and 79 that are all formed by one ion implant step, i.e. an implant of $1.5 \times 10^{15}$ boron atoms/cm$^2$. This simultaneous formation of resistors and bases is not believed to contribute to the excellent control of offset voltage that was achieved. The offset control realized is attributed only to the combination of balanced thermal coupling of amplifier component pairs and to the enlarged sizes especially of the Hall voltage amplifying transistors.

Although in the preferred embodiment described above, the Hall cells are separated from each other by an isolation wall 22, the substitution of other known compound Hall element structures that include at least four sub-Hall cells formed in a single epitaxial pocket, is considered to fall within the scope of this invention.

What is claimed is:

1. An integrated circuit chip comprising a semiconductor substrate of one conductivity type, an epitaxial layer of the opposite conductivity type on one face of said substrate, a Hall element comprising an array of four Hall cells having their outputs connected in parallel disposed in an approximately central portion of the outer surface of said epitaxial layer, a differential amplifier circuit including two bipolar transistors, another portion of said epitaxial layer surrounding said Hall element containing said differential transistors and other circuit components, said Hall element being separated from said transistors and other circuit components by a moat surrounding said Hall element, said moat being comprised of a pair of heavily doped isolation walls of said one conductivity type, having a band of epitaxial material of opposite conductivity therebetween to isolate said Hall element from built-in stresses in said surrounding epitaxial layer portion adjacent to said Hall element, said transistors positioned adjacent to each other and on either side of an axis of said Hall element that runs through the center of said Hall element so that said transistors have equal thermal coupling to said Hall element, each of said transistors having an emitter with an area no less than about thirty percent that of one of said Hall cells.

2. The integrated circuit chip of claim 1 wherein each of said emitters have an approximately round geometry at the epitaxial layer surface.

3. The integrated circuit chip of claim 2 wherein said differential amplifier circuit is further comprised of two emitter resistors connected, respectively, to said emitters, said emitter resistors having a width and a length greater than 40 microns so that in their manufacture the resistance value ratio of said resistors may be repeatably maintained within a closure tolerance.

4. The integrated circuit chip of claim 3 wherein said emitter resistors are positioned symmetrically on either side of a line within 20 degrees of a radial axis of said Hall element.

5. The integrated circuit chip of claim 1 wherein said differential amplifier circuit is further comprised of two collector load resistors connected, respectively, to the collector of said two transistors, said resistors being adjacent to each other and positioned on either side of a line that is within 20 degrees of a radial axis of said Hall element.

6. The integrated circuit chip of claim 5 wherein said diffused collector resistors are each at least 15 microns wide.

* * * * *

UNITED STATES PATENT AND TRADEMARK OFFICE
CERTIFICATE OF CORRECTION

PATENT NO. : 4,709,214
DATED : November 24, 1987
INVENTOR(S) : Jacob K. Higgs

It is certified that error appears in the above—identified patent and that said Letters Patent is hereby corrected as shown below:

Cover page, under "[22] Filed:" the date should read -- Apr. 28, 1986 --

Claim 3, line 7 (Column 6, line 53) "closure" should read -- close --

Signed and Sealed this

Twelfth Day of April, 1988

Attest:

DONALD J. QUIGG

*Attesting Officer*     *Commissioner of Patents and Trademarks*